(12) United States Patent
Iwasaki et al.

(10) Patent No.: US 9,947,396 B2
(45) Date of Patent: Apr. 17, 2018

(54) NONVOLATILE STORAGE DEVICE AND METHOD OF CONTROLLING THE SAME

(71) Applicant: CHUO UNIVERSITY, Hachioji-shi, Tokyo (JP)

(72) Inventors: Tomoko Iwasaki, Tokyo (JP); Kosuke Miyaji, Tokyo (JP); Ken Takeuchi, Tokyo (JP)

(73) Assignee: CHUO UNIVERSITY, Tokyo (JP)

( * ) Notice: Subject to any disclaimer, the term of this patent is extended or adjusted under 35 U.S.C. 154(b) by 0 days.

(21) Appl. No.: 14/429,249

(22) PCT Filed: Aug. 9, 2013

(86) PCT No.: PCT/JP2013/004823
§ 371 (c)(1),
(2) Date: Mar. 18, 2015

(87) PCT Pub. No.: WO2014/045512
PCT Pub. Date: Mar. 27, 2014

(65) Prior Publication Data
US 2015/0228339 A1    Aug. 13, 2015

(30) Foreign Application Priority Data
Sep. 18, 2012    (JP) .................................. 2012-204340

(51) Int. Cl.
G11C 13/00    (2006.01)
G11C 11/56    (2006.01)
G11C 29/06    (2006.01)

(52) U.S. Cl.
CPC ...... *G11C 13/0009* (2013.01); *G11C 13/0002* (2013.01); *G11C 13/004* (2013.01);
(Continued)

(58) Field of Classification Search
CPC .............. G11C 13/0009; G11C 13/004; G11C 13/0064; G11C 13/0069; G11C 13/0002;
(Continued)

(56) References Cited

U.S. PATENT DOCUMENTS

2008/0025072 A1    1/2008    Tamai et al.
2009/0067212 A1*    3/2009    Shimizu .................. B82Y 10/00
                                            365/148
(Continued)

FOREIGN PATENT DOCUMENTS

CN    101789262 A    7/2010
JP    2010-170617 A    8/2010
(Continued)

OTHER PUBLICATIONS

Sep. 3, 2013 International Search Report issued in International Patent Application No. PCT/JP2013/004823.
(Continued)

*Primary Examiner* — Ajay Ojha
(74) *Attorney, Agent, or Firm* — Oliff PLC

(57) ABSTRACT

To improve a reading speed and a writing speed while preventing occurrence of disturbance in a resistance storage element, specifically, a nonvolatile storage device that has a memory having at least one nonvolatile resistance storage element and a control unit configured to write a high resistance state or a low resistance state to the resistance storage element, wherein the control unit applies a bias to the resistance storage element in a verification operation carried out after writing the high resistance state, or applies a bias to the resistance storage element in a verification operation carried out after writing the low resistance state, these biases being in directions opposite to each other.

9 Claims, 13 Drawing Sheets

(52) U.S. Cl.
CPC ...... *G11C 13/0033* (2013.01); *G11C 13/0064* (2013.01); *G11C 13/0069* (2013.01); *G11C 11/56* (2013.01); *G11C 13/0004* (2013.01); *G11C 29/06* (2013.01); *G11C 2013/0047* (2013.01); *G11C 2013/0057* (2013.01); *G11C 2013/0073* (2013.01); *G11C 2013/0092* (2013.01); *G11C 2213/79* (2013.01); *G11C 2213/82* (2013.01)

(58) Field of Classification Search
CPC ..... G11C 13/0004; G11C 29/06; G11C 11/56; G11C 2013/0092; G11C 2213/79; G11C 2013/0073
See application file for complete search history.

(56) References Cited

U.S. PATENT DOCUMENTS

| | | | |
|---|---|---|---|
| 2010/0182820 A1 | 7/2010 | Kitagawa et al. | |
| 2012/0026777 A1 | 2/2012 | Kitagawa et al. | |
| 2012/0218809 A1* | 8/2012 | Kitagawa | G11C 13/0004 365/148 |
| 2013/0088911 A1 | 4/2013 | Nakura et al. | |
| 2013/0301335 A1* | 11/2013 | Ong | G11C 29/06 365/148 |
| 2014/0003124 A1* | 1/2014 | Youn | G11C 13/004 365/148 |

FOREIGN PATENT DOCUMENTS

| | | |
|---|---|---|
| JP | 2012-033219 A | 2/2012 |
| JP | 2012-064286 A | 3/2012 |
| JP | 2013-084324 A | 5/2013 |
| KR | 20120011810 A | 2/2012 |

OTHER PUBLICATIONS

Higuchi et al.; "Investigation of Verify-Programming Methods to Achieve 10 Million Cycles for 50nm HfO2 ReRAM;" IEEE International Memory Workshop (IMW); 2012; pp. 119-122.
Sep. 3, 2013 Written Opinion issued in International Patent Application No. PCT/JP2013/004823.
Apr. 19, 2016 Office Action issued in Korean Patent Application No. 10-2015-7006884.
Aug. 1, 2016 Office Action issued in Chinese Application No. 201380048634.8.
Oct. 28, 2016 Office Action issued in Korean Patent Application No. 10-2015-7006884.
Mar. 21, 2017 Office Action issued in Japanese Patent Application No. 2014-536567.
Mar. 28, 2017 Office Action issued in Chinese Patent Application No. 201380048634.8.
Jul. 20, 2017 Office Action issued in Chinese Patent Application No. 201380048634.8.

* cited by examiner

Reset

Set

FIG. 3A

Verification of HRS

|  | Direction | Voltage (V) | Reading current (μA) |
|---|---|---|---|
| Conventional technique | Forward bias | Vds=0.1 | 0.5 |
| Present embodiment | Reverse bias | Vds=-0.5 | 4 |

FIG. 3B

Verification of LRS

|  | Direction | Voltage (V) | Reading current (μA) |
|---|---|---|---|
| Conventional technique | Forward bias | Vds=0.1 | 2 |
| Present embodiment | Forward bias | Vds=0.3 | 10 |

Read with reverse bias

Write back

Set

Reset

Current

Resistance

NONVOLATILE STORAGE DEVICE AND METHOD OF CONTROLLING THE SAME

CROSS REFERENCE TO RELATED APPLICATION

This application claims priority to and the benefit of Japanese Patent Application No. 2012-204340 (filed on Sep. 18, 2012), the entire contents of which are incorporated herein by reference.

TECHNICAL FIELD

The present invention relates to a nonvolatile storage device and a method of controlling the same, and more specifically, to a nonvolatile storage device that includes a nonvolatile memory such as a resistance random access memory (ReRAM: Resistance Random Access Memory) and a control unit for controlling the resistance random access memory, and also to a method of controlling the nonvolatile storage device.

BACKGROUND

Recently, ReRAM has been attracting attention as a nonvolatile memory that could replace a flash memory. The ReRAM is characteristic in fast writing and high density and thus expected to serve as a nonvolatile memory used for a business purpose or used in a mobile system.

Typically, the ReRAM is composed of a plurality of memory cells arranged in a matrix form, and each of the memory cells includes a nonvolatile resistance storage element. The memory cell has a structure including one resistance storage element (1R type) alone, or another structure including one transistor and one resistance storage element (1T1R type). FIG. 9 illustrates an example of the structure of the memory cell of the 1T1R-type. The memory cell of the 1T1R-type includes three terminals: a drain, a gate, and a source. The nonvolatile storage device applies a voltage to the gate of a specific memory cell and thus selects a memory cell to write data thereto, or to read data therefrom.

FIG. 10 is a diagram illustrating an example of a structure of the resistance memory element. The resistance memory element has a structure in which a memory layer is placed between a drain electrode and a source electrode. The resistance memory element is characteristic in being capable of changing resistance of the memory layer by applying a voltage pulse between the drain electrode and the source electrode. The resistance memory element stores information based on the magnitude of resistance. A state having high resistance is referred to as a high resistance state (HRS: High Resistance State), and a state having low resistance is referred to as a low resistance state (LRS: Low Resistance State).

FIGS. 11A and 11B illustrate examples of the voltage pulse applied to the resistance memory element at the time of writing. FIG. 11A illustrates an example of the voltage pulse applied between the drain and the source in an operation to write the LRS (referred to as "set" hereinafter) to the resistance storage element. A horizontal axis represents time, and a vertical axis represents Vds. Here, the symbol Vds represents a drain voltage with reference to a source voltage. Accordingly, when the Vds is positive, the drain voltage is higher than the source voltage and, when the Vds is negative, the source voltage is higher than the drain voltage. At the time of the set, as illustrated in FIG. 11A, a voltage pulse having a width of 50 ns and Vds at 2 V is applied.

FIG. 11B illustrates an example of the voltage pulse applied between the drain and the source in an operation to write the HRS (referred to as "reset" hereinafter) to the resistance storage element. At the time of the reset, a voltage pulse having a width of 20 ns and the Vds at −2 V is applied. In this way, directions of the voltage pulse applied between the drain and the source at the time of the set and at the time of the reset become opposite to each other. Hereinafter, a direction same as the voltage pulse applied at the time of the set, i.e., a positive Vds direction is referred to as "a forward bias", and a direction the same as the voltage pulse applied at the time of the reset, i.e., a negative Vds direction is referred to as "a reverse bias".

Writing the LRS or the HRS to the resistance memory element is characteristic in being not always successfully carried out by application of the voltage pulse one time. As such, in writing the LRS or the HRS to the resistance storage element, an operation referred to as verification of successful writing (verification) is carried out by reading after application of a set/rest pulse (see NPL 1 set forth below). When it is determined as a result of the verification that the writing has been unsuccessful, the set/rest pulse is applied again, followed by execution of the verification. This process is repeated until the writing is performed successfully.

In order to find which one of the HRS and the LRS is written to the resistance storage element, the HRS or the LRS may be read by applying the voltage between the drain and the source and detecting a current. FIG. 12A illustrates dependence of a current flowing to the resistance storage element on the Vds. In FIG. 12A, white circles represent currents flowing to the resistance storage element including the LRS written thereto, and black circles represent currents flowing to the resistance storage element including the HRS written thereto. FIG. 12B is a graph with a vertical axis representing resistance calculated from the current of FIG. 1A. In FIG. 12B, white circles represent resistance of the resistance storage element including the LRS written thereto, and black circles represent resistance of the resistance storage element including the HRS written thereto. Since the resistance is significantly different between the HRS and the LRS as illustrated in FIG. 12B, the HRS and the LRS may be identified based on the magnitude of the resistance.

CITATION LIST

Non-Patent Literatures

NPL 1: Kazuhide Higuchi et al, "Investigation of Verify-Programming Methods to Achieve 10 Million Cycles for 50 nm Hf02 ReRAM", IEEE International Memory Workshop (IMW), pp. 119-122, 2012

In order to improve a reading speed of the ReRAM, the voltage applied between the drain and the source at the time of reading may be increased so as to increase a reading current. However, the increase in the reading current is likely to cause a problem called disturbance (disturb). Here, the disturbance refers to a phenomenon in which, due to the current flown between the drain and the source at the time of the reading, the resistance changes in an undesirable direction of the magnitude thereof. That is, the disturbance is a phenomenon in which the resistance of the resistance storage element including the HRS written thereto reduces, or the resistance of the resistance storage element including the LRS written thereto increases. Occurrence of the disturbance is undesirable as it possibly leads to destruction of data stored in the resistance storage element.

FIG. 13 illustrates a change in the resistance when the forward bias is continuously applied between the drain and the source of the resistance storage element. For the HRS, three voltages are applied: the Vds at 0.1 V, 0.3 V, and 0.5 V, which are represented by a black triangle, a black square, and a black circle, respectively. For the LRS, the Vds at 0.5 V alone is applied, which is represented by a white circle.

When the forward bias is continuously applied to the resistance storage element including the HRS written thereto, the disturbance does not occur when the Vds is at 0.1 V and at 0.3 V. On the other hand, when the Vds is at 0.5 V, the resistance becomes low during an application time between 100 and 1000 seconds, causing the disturbance.

When the forward bias is continuously applied to the resistance storage element including the LRS written thereto, the application of the Vds at 0.5 V, which is a relatively high voltage, causes no increase in the resistance and thus no disturbance.

FIG. 14 illustrates a change in the resistance when the reverse bias is continuously applied between the drain and the source of the resistance storage element. For the HRS, the Vds at −0.5 V is applied, which is represented by a black circle. For the LRS, three voltages are applied: the Vds at −0.1 V, −0.3 V, and −0.5 V, which are represented by a white triangle, a white square, and a white circle, respectively.

When the reverse bias is continuously applied to the resistance storage element including the HRS written thereto, the application of the Vds at −0.5 V, which is a relatively high voltage, causes no decrease in the resistance and thus no disturbance.

When the reverse bias is continuously applied to the resistance storage element including the LRS written thereto, although the Vds at −0.1 V does not cause the disturbance, the Vds at −0.3 V and the Vds at −0.5 V increase the resistance during the application time between 10 and 1000 seconds, causing the disturbance.

As described above, when the Vds is increased so as to increase the reading current, the forward bias causes the disturbance in the resistance storage element including the HRS written thereto. Also, when the Vds is increased so as to increase the reading current, the reverse bias causes the disturbance in the resistance storage element including the LRS written thereto.

That is, the increase in the application voltage in order to improve the reading speed is likely to cause the disturbance, while a reduction in the applied voltage so as to prevent the disturbance slows down the reading speed. Accordingly, the reading speed and the occurrence of the disturbance are in a trade-off relation. Normally, priority is placed on prevention of the disturbance, and the reading is executed by applying a low voltage such as the Vds at approximately 0.1 V as the forward bias. As a result, there is a problem that the current flowing to the resistance storage element at the time of the reading is small, slowing down the reading speed accordingly.

In writing to the resistance memory element, further, the verification of successful writing is executed, in which, similarly to data reading, the voltage is applied between the drain and the source of the resistance storage element and the current is detected. Accordingly, the writing to the resistance memory element has also a problem of the trade-off relation similar to that of the reading and, in order to prevent the disturbance, the verification is executed by applying a low voltage such as Vds at approximately 0.1 V as the forward bias. As a result, there is a problem that a verification speed is reduced, slowing down a writing speed accordingly.

Accordingly, an object of the present invention in view of the above problems is to provide a nonvolatile storage device capable of improving the reading speed and the writing speed while preventing occurrence of the disturbance in the resistance storage element, and also to provide a method of controlling the nonvolatile storage device.

SUMMARY

In order to solve the above problems, a nonvolatile storage device according to the present invention includes:
a memory including at least one nonvolatile resistance storage element; and
a control unit configured to write a high resistance state (HRS) or a low resistance state (LRS) to the resistance storage element,
wherein the control unit applies a bias to the resistance storage element in a verification operation carried out after writing the high resistance state, or applies a bias to the resistance storage element in a verification operation carried out after writing the low resistance state, these biases being in directions opposite to each other.

According to the nonvolatile storage device of the present invention, preferably, the control unit applies a reverse bias to the resistance storage element at the time of the verification operation carried out after writing the high resistance state, or applies a forward bias to the resistance storage element at the time of the verification operation carried out after writing the low resistance state.

According to the nonvolatile storage device of the present invention, preferably, the control unit applies the same voltage to a source of the resistance storage element at the time of writing the high resistance state and at the time of the verification operation carried out thereafter, or applies the same voltage to the source of the resistance storage element at the time of writing the low resistance state and at the time of the verification operation carried out thereafter.

According to the nonvolatile storage device of the present invention, preferably, the control unit applies the reverse bias to the resistance storage element when reading data from the memory.

According to the nonvolatile storage device of the present invention, preferably, the control unit, when determining at the time of reading the data from the memory that disturbance has been occurred in a resistance storage element including the low resistance state written thereto, writes the low resistance state to the resistance storage element.

According to the nonvolatile storage device of the present invention, preferably, the control unit, when determining that the disturbance has been occurred and writes the low resistance state to the resistance storage element, applies the same voltage as that applied at the time of reading the data from the memory to the source of the resistance storage element.

According to the nonvolatile storage device of the present invention, preferably, the control unit determines whether the disturbance has been occurred based on whether resistance of the resistance storage element including the low resistance state written thereto is larger than a normal resistance value of the low resistance state by at least a predetermined ratio.

In order to solve the above problems, a method of controlling a nonvolatile storage device according to the present invention is a method of controlling the nonvolatile storage device having a memory including at least one nonvolatile resistance storage element, the method includes:
- a writing step of writing a high resistance state (HRS) or a low resistance state (LRS) to the resistance storage element; and
- a verification step of verifying successful writing of the high resistance state (FIRS) or the low resistance state (LRS) carried out after the writing step,
- wherein the verification step applies a bias to the resistance storage element in a verification operation carried out after writing the high resistance state, or applies a bias to the resistance storage element in a verification operation carried out after writing the low resistance state, these biases being applied in directions opposite to each other.

According to the present invention, the nonvolatile storage device capable of improving a reading speed and a writing speed while preventing occurrence of the disturbance in the resistance storage element, and a method of controlling the nonvolatile storage device may be provided.

BRIEF DESCRIPTION OF THE DRAWINGS

FIGS. 3A and 3B are tables illustrating the bias applied at the time of the verification according to one embodiment of the present invention;

DETAILED DESCRIPTION

Hereinafter, an embodiment of the present invention will be described with reference to the accompanying drawings.

Figure 1:
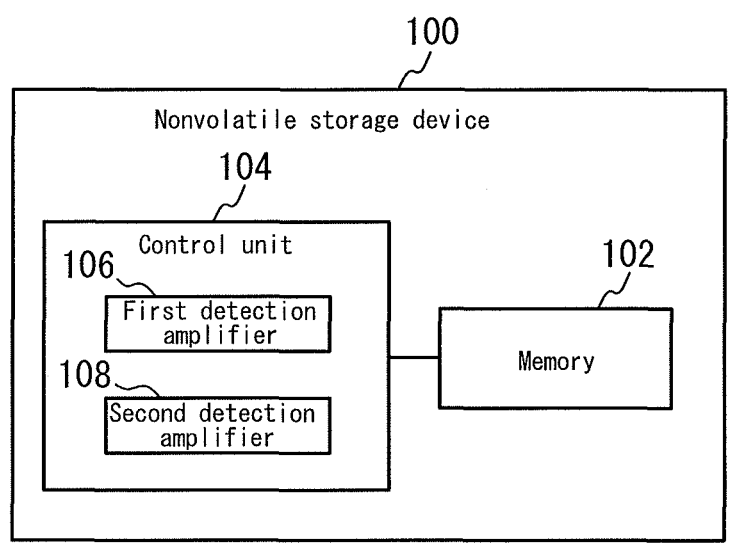
FIG. 1 is a diagram illustrating a schematic configuration of a nonvolatile storage device according to one embodiment of the present invention.

FIG. 1 is a diagram illustrating a schematic configuration of a nonvolatile storage device according to one embodiment of the present invention. A nonvolatile storage device 100 includes a memory 102 and a control unit 104.

Figure 9:
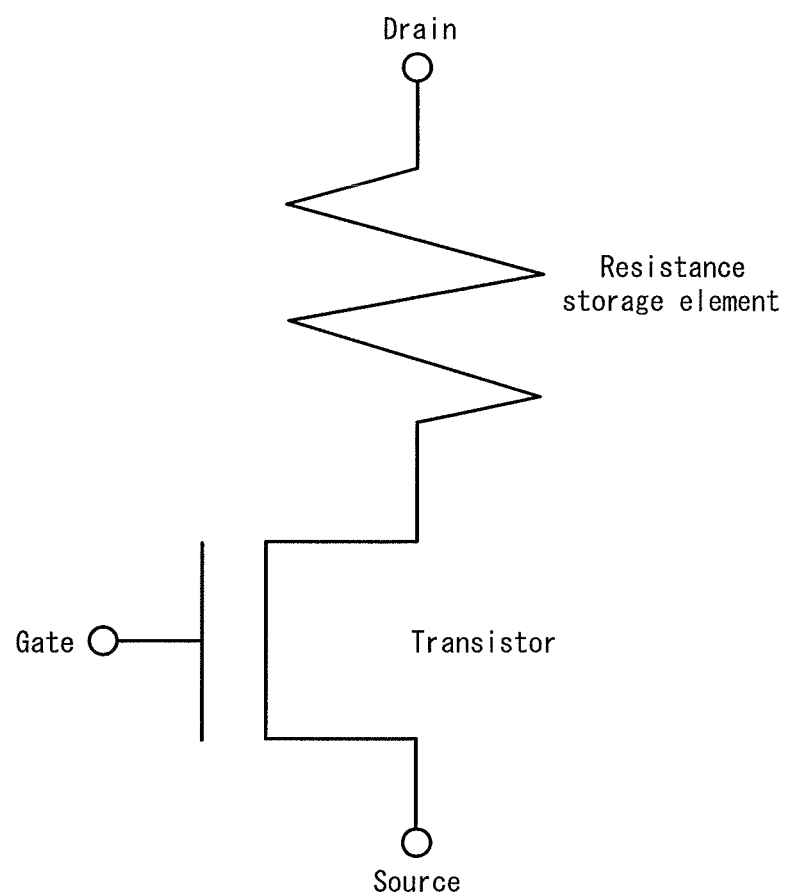
FIG. 9 is a diagram illustrating a configuration of a memory cell of a 1T1R type.
Figure 10:
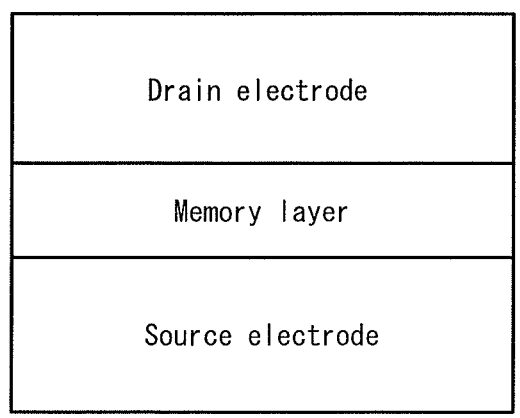
FIG. 10 is a diagram illustrating an example of a structure of a resistance storage element.
Figure 11A:
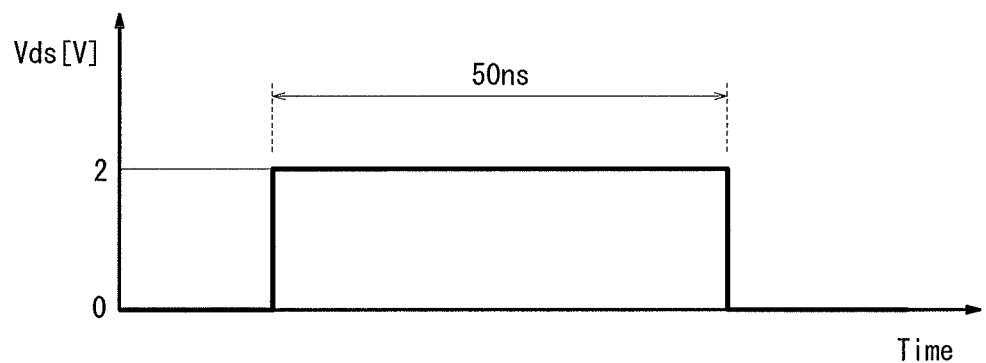
FIGS. 11A and 11B are diagrams illustrating an example of a voltage pulse applied at the time of the writing.
Figure 11B:
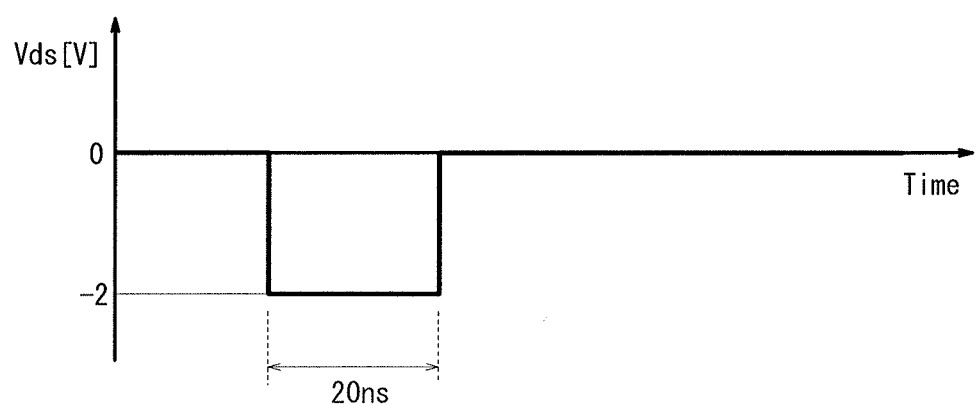
Figure 12A:
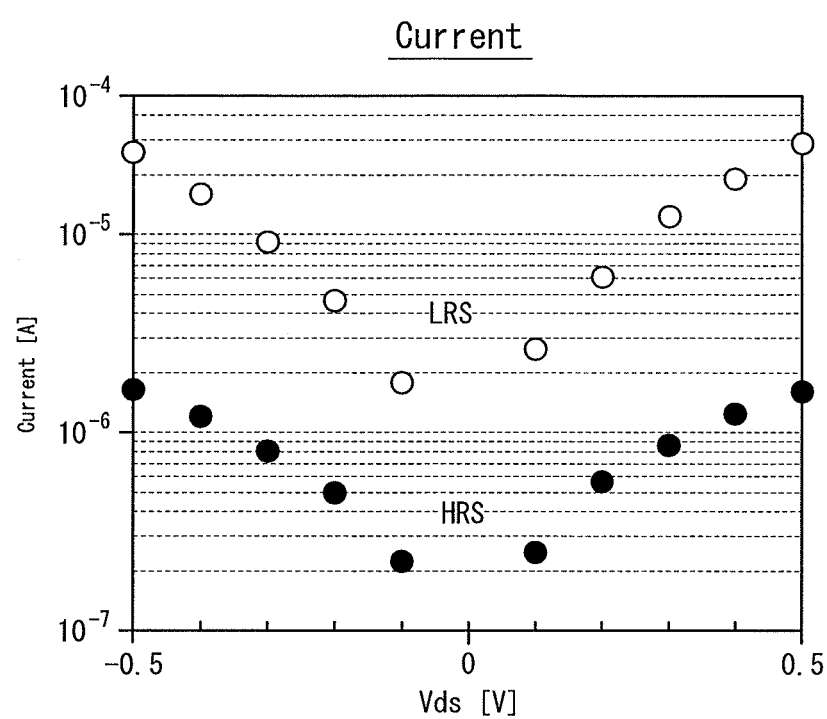
FIGS. 12A and 12B are diagrams illustrating reading voltage dependence of a current flowing to the resistance storage element and reading voltage dependence of resistance of the resistance storage element.
Figure 12B:
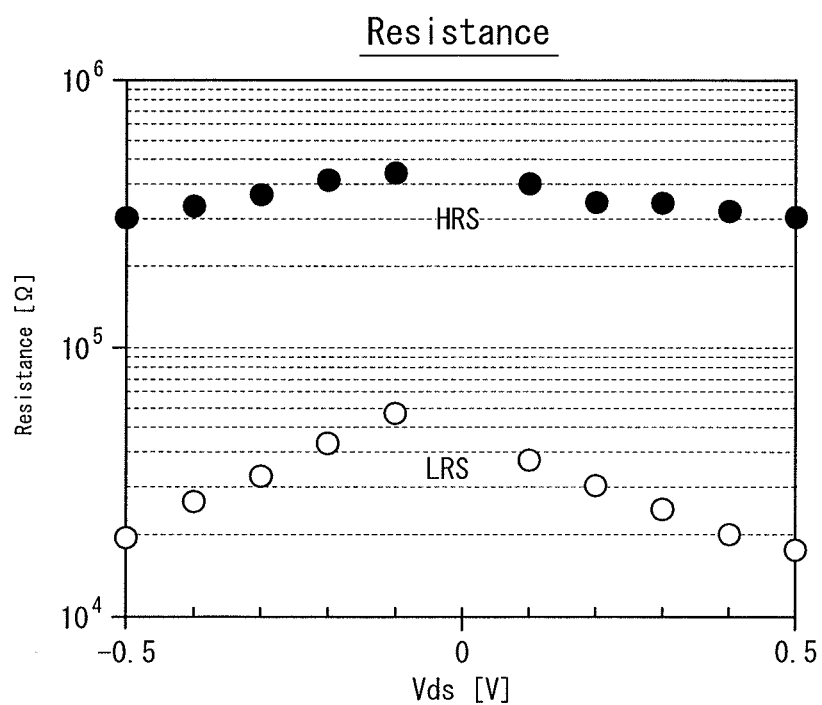

The memory 102 includes at least one memory cell arranged in a matrix form, and each memory cell includes a nonvolatile storage element. For example, the memory cell is of a 1T1R type as illustrated in FIG. 9. The memory cell of the 1T1R type includes three terminals: a drain, a gate, and a source and may read or write data by applying a voltage between the drain and the source while applying a positive voltage to a gate voltage. The drain of the memory cell is connected to a bit line, and the source is connected to a source line. The source line is usually shared by a plurality of memory cells and thus has a large parasitic capacitance.

The control unit 104 controls the voltage applied to the memory cell in the memory 102. The control unit 104 selects a memory cell for writing/reading the data by applying a voltage to the gate of the memory cell and writes/reads the data by applying the voltage between the drain and the source of the memory cell.

The control unit 104 includes a first detection amplifier 106 and a second detection amplifier 108. The first detection amplifier 106 and the second detection amplifier 108 detect a current flowing to the memory cell selected by the control unit 104. Operations of the first detection amplifier 106 and the second detection amplifier 108 will be described later.

(Writing)

Figure 2A:
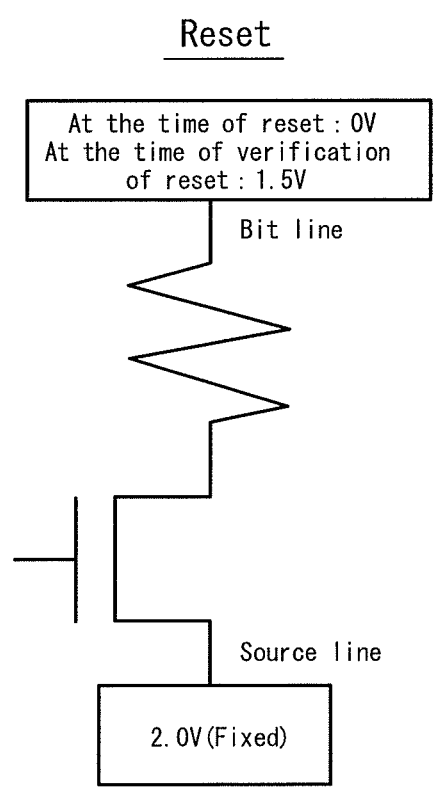
FIGS. 2A and 2B are diagrams illustrating a bias applied at the time of writing and a bias applied at the time of verification according to one embodiment of the present invention.
Figure 2B:
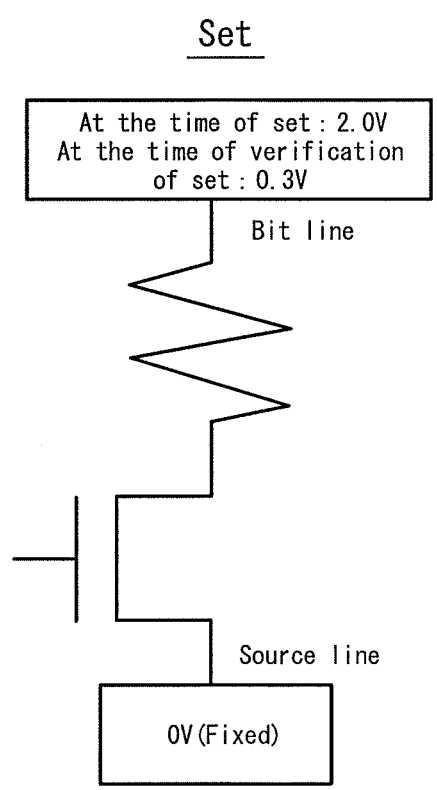
Figure 14:
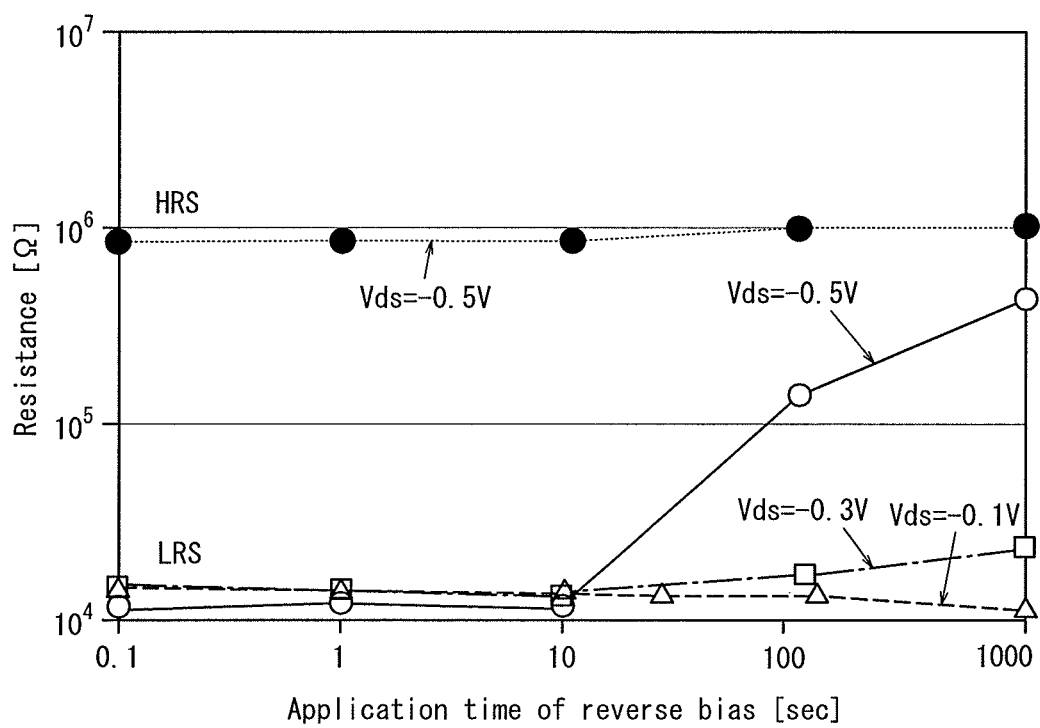
FIG. 14 is a diagram illustrating a change in the resistance when a reverse bias is applied to the resistance storage element for a long time.

FIGS. 2A and 2B are diagrams illustrating a bias applied at the time of writing and a bias applied at the time of verification according to one embodiment of the present invention. FIG. 2A illustrates a bias voltage at the time of reset. The control unit 104, when writing HRS to the resistance storage element by applying a reset pulse, applies a voltage pulse to set the source line at 2.0 V and the bit line at 0 V. Also, the control unit 104 applies a reverse bias to the resistance storage element at the time of verification of the reset. As illustrated in FIG. 2A, for example, the control unit 104 applies a voltage at 2.0 V to the source line and a voltage at 1.5 V to the bit line. When the reverse bias is applied to the resistance storage element including the HRS written thereto as described above, application of a voltage higher than 0.1 V does not cause disturbance as illustrated in FIG. 14. The control unit 104, by executing the verification by applying a voltage at 0.5 V, which is higher than a conventionally applied voltage at 0.1 V, may improve a verification speed as compared with a conventional verification speed and, as a result, improve a writing speed.

At the time of the reset and also at the time of the verification thereof, the control unit 104 applies a fixed voltage at 2.0 V to the source line. Since the control unit 104 does not change the voltage applied to the source line having a large parasitic capacitance, a transition time from the reset to the verification thereof may be reduced.

Figure 13:
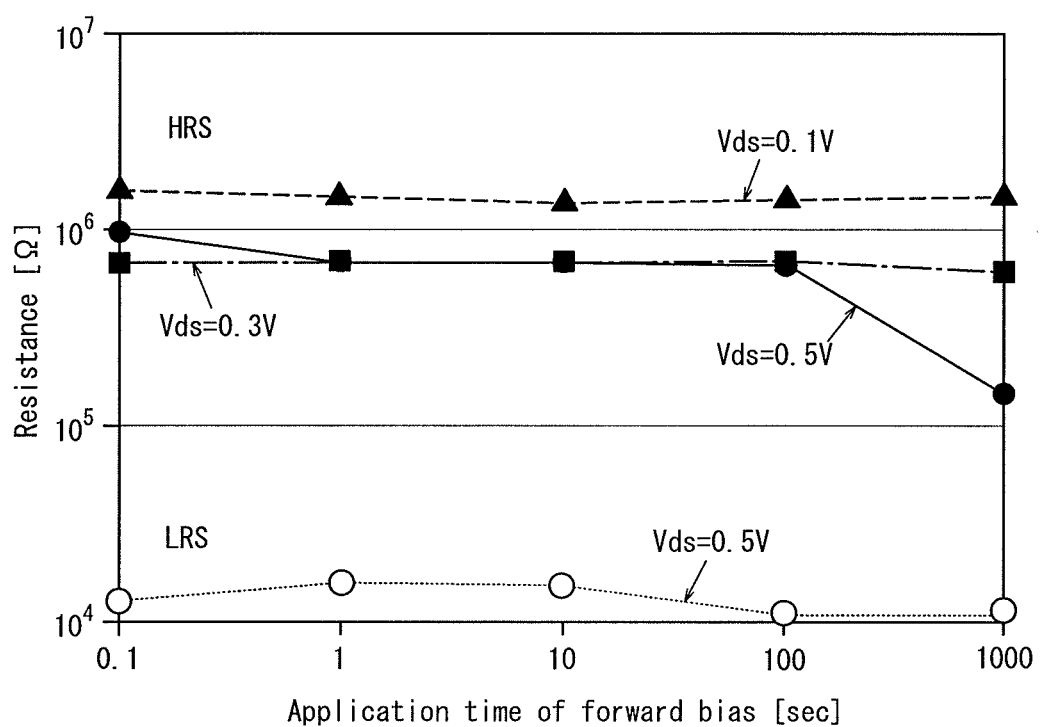
FIG. 13 is a diagram illustrating a change in the resistance when a forward bias is applied to the resistance storage element for a long time.

FIG. 2B illustrates the bias voltage applied at the time of set. The control unit 104, when writing LRS to the resistance storage element by applying a set pulse, applies a voltage pulse to set the source line at 0 V and the bit line at 2.0 V. Also, the control unit 104 applies a forward bias to the resistance storage element at the time of verification of the set. As illustrated in FIG. 2B, for example, the control unit 104 applies a voltage at 0 V to the source line and a voltage at 0.3 V to the bit line. When the forward bias is applied to the resistance storage element including the LRS written thereto as described above, application of a voltage higher than 0.1 V does not cause disturbance as illustrated in FIG. 13. The control unit 104, by executing the verification by applying a voltage at 0.3 V, which is higher than the conventionally applied voltage at 0.1 V, may improve the verification speed as compared with the conventional verification speed and, as a result, improve the writing speed.

Further, at the time of the set and at the time of the verification thereof, the control unit 104 applies a fixed voltage at 0 V to the source line. Since the control unit 104 does not change the voltage applied to the source line having a large parasitic capacitance, a transition time from the set to the verification thereof may be reduced.

As described above, when the data are written to the memory 102, which one of the HRS and the LRS is written is known. Therefore, the control unit 104 may apply the voltage higher than the conventionally applied voltage in an appropriate direction for the verification. Thereby, the writing speed may be improved while avoiding occurrence of the disturbance.

FIGS. 3A and 3B are tables illustrating the bias applied at the time of the verification according to one embodiment of the present invention. FIG. 3A illustrates a comparison of conditions of the bias applied at the time of the verification of the HRS between a conventional technique and the present embodiment. At the time of the verification of the HRS, the conventional technique applies the forward bias at 0.1 V, while the present embodiment applies the reverse bias at 0.5 V. Therefore, a reading current of the conventional technique is at 0.5 µA, while the reading current of the present embodiment is at 4 µA, which is 8 times higher than the reading current of the conventional technique.

Also, FIG. 3B illustrates a comparison of conditions of the bias applied at the time of the verification of the LRS between the conventional technique and the present embodiment. At the time of the verification of the LRS, the conventional technique applies the forward bias at 0.1 V, while the present embodiment applies the forward bias at 0.3 V. Therefore, the reading current of the conventional technique is at 2 µA, while the reading current of the present embodiment is at 10 µA, which is 5 times higher than the reading current of the conventional technique.

According to the present embodiment, as described above, at the time of the verification of the HRS and also at the time of the verification of the LRS, the reading current may be increased while preventing occurrence of the disturbance. Thereby, the writing speed of writing to the memory 102 may be improved.

Figure 4:
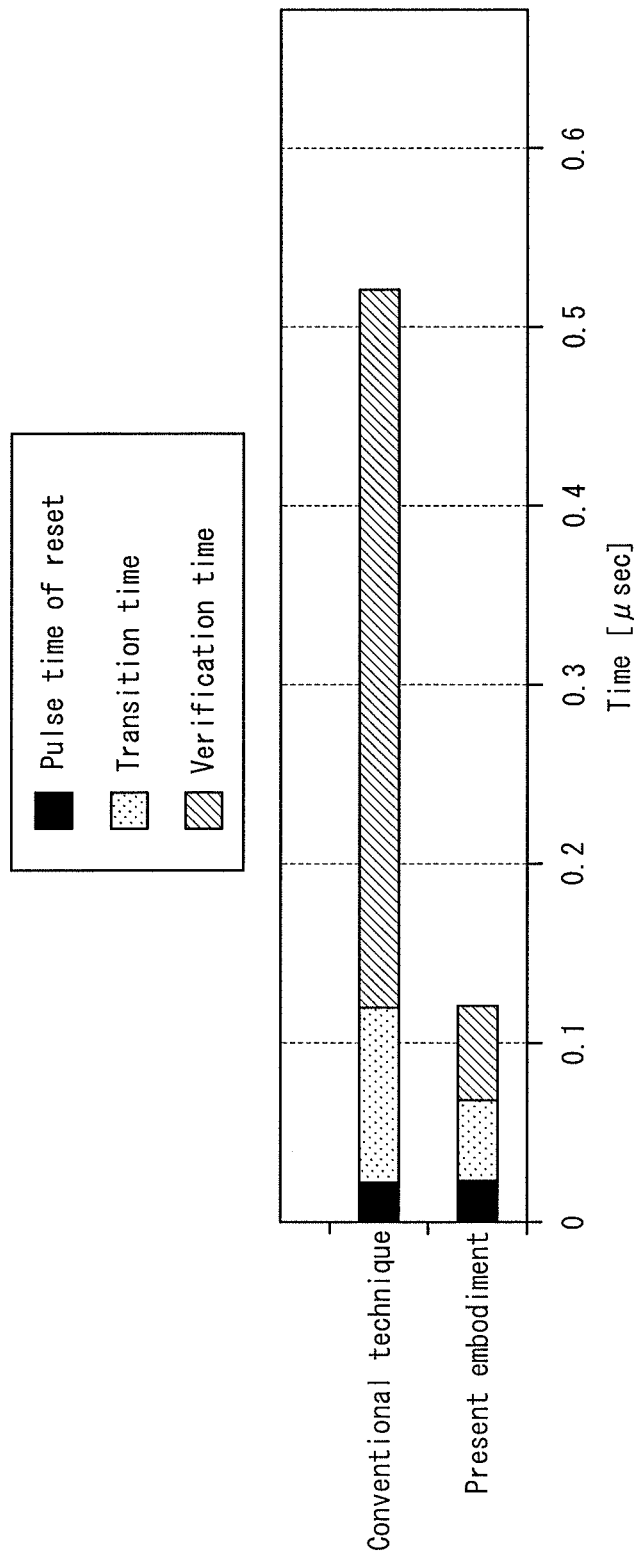
FIG. 4 is a diagram illustrating a writing time at the time of reset of the nonvolatile storage device according to one embodiment of the present invention.

FIG. 4 illustrates times when the reset pulse is applied once and the verification is executed once. Although application times of the reset pulse are not different between the conventional technique and the present embodiment, a transition time from the application of the reset pulse to bias setting for the verification according to the present embodiment is shorter than that of the conventional technique. This is because the transition of the conventional technique is carried out by changing the voltage of the source line having a large parasitic capacitance, while the transition of the present embodiment from the application of the reset pulse to the bias setting for the verification is carried out with the fixed voltage of the source line.

As to a verification time, also, since the present embodiment applies the voltage at 0.5 V, which is higher than the conventionally applied voltage at 0.1 V, between the drain and the source, the verification time may be significantly reduced as compared with that of the conventional technique.

Figure 5:
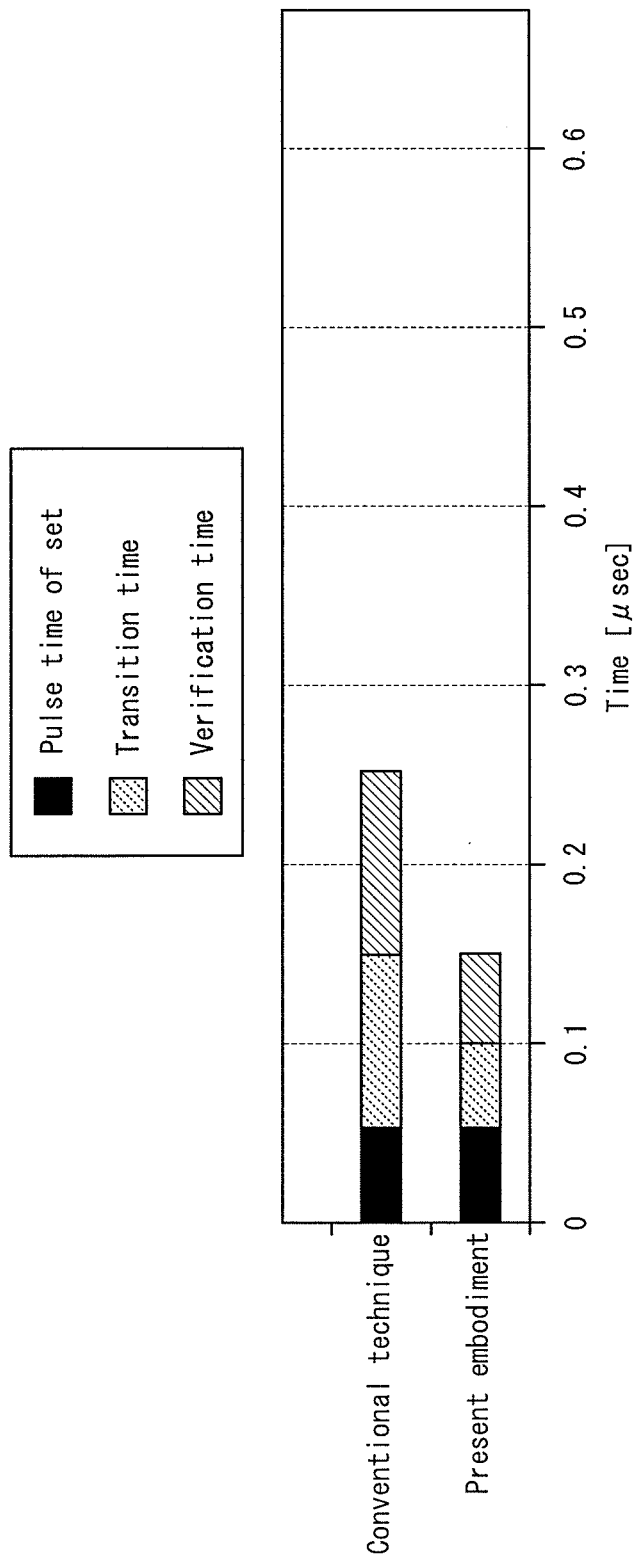
FIG. 5 is a diagram illustrating a writing time at the time of set of the nonvolatile storage device according to one embodiment of the present invention.

FIG. 5 illustrates times when the set pulse is applied once and the verification is executed once. Although application times of the set pulse are not different between the conventional technique and the present embodiment, a transition time from the application of the set pulse to the bias setting for the verification according to the present embodiment is shorter than that of the conventional technique. This is because the transition of the conventional technique is carried out by changing the voltage of the bit line from 2.0 V to 0.1 V, while the transition of the present embodiment is carried out changing the voltage of the bit line from 2.0 V to 0.3 V, which is a smaller change in the voltage.

As to the verification time, also, since the present embodiment applies the voltage at 0.3 V, which is higher than the conventionally applied voltage at 0.1 V, between the drain and the source, the verification time may be significantly reduced as compared with that of the conventional technique.

Figure 6:
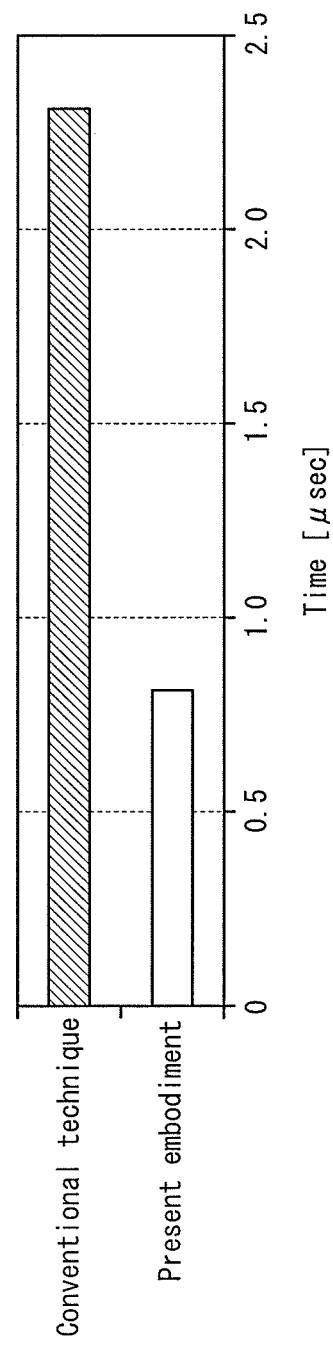
FIG. 6 is a diagram illustrating time taken to write one page of the nonvolatile storage device according to one embodiment of the present invention.

FIG. 6 is a diagram illustrating time taken to write one page of the nonvolatile storage device according to one embodiment of the present invention (3 times of the set and 3 times of the reset). In an example illustrated in FIG. 6, the writing time is reduced by approximately 68% from 2.3 µs to 0.8 µs.

(Reading)

Next, the operation of the control unit 104 to read the data from the memory 102 will be described. When the control unit 104 reads the data from the memory 102, it is unknown which one of the HRS and the LRS is written to the resistance storage element. Therefore, unlike at the time of the verification of data writing, a selection of an appropriate bias direction may not be performed based on which one of the HRS and the LRS is written to the resistance storage element.

Accordingly, the control unit 104 reads the data from the memory 102 by applying the reverse bias and carries out write-back (write back). Here, the "write back" refers to an operation to rewrite when a state of the resistance storage element is deteriorated due to the disturbance.

Figure 7A:
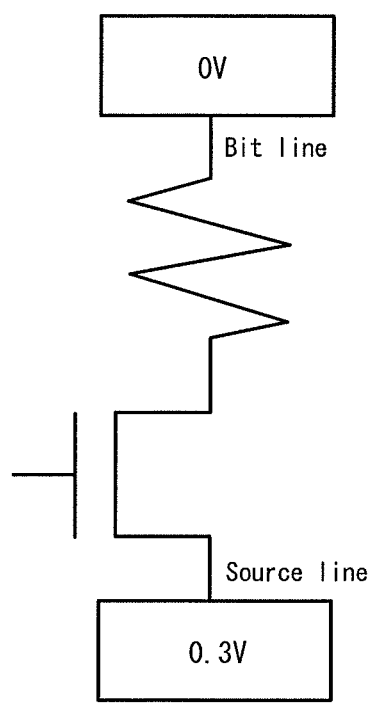
FIGS. 7A and 7B are diagrams illustrating the bias applied at the time of reading and a bias applied at the time of write-back according to one embodiment of the present invention.
Figure 7B:
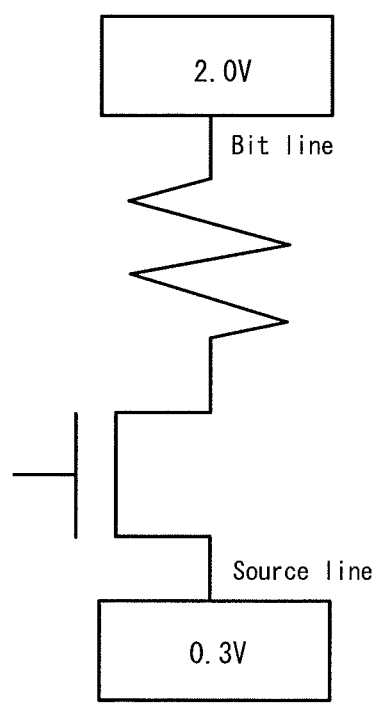

FIGS. 7A and 7B are diagrams illustrating a bias applied at the time of the reading and a bias applied at the time of the write back according to one embodiment of the present invention.

As illustrated in FIG. 7A, the control unit 104 sets the bias for applying a voltage at 0.3 V to the source line and a voltage at 0 V to the bit line, that is, applies the reverse bias to the resistance storage element and thereby reads the data from the memory 102. In this case, although the disturbance does not occur when the HRS is written to the resistance storage element, the disturbance possibly occurs when the LRS is written to the resistance storage element.

Therefore, when the LRS is written to the resistance storage element and the disturbance occurs, the control unit 104, as illustrated in FIG. 7B, carries out the write back by setting a bias to set the source line at 0.3 V and the bit line at 2.0 V. Thereby, the control unit 104 may restore an original state of the LRS disturbed in the memory 102. In this case, in the operations illustrated in FIG. 7A and FIG. 7B, since the control unit 104 does not change the voltage of the source line having a large parasitic capacitance, a transition from a bias state in FIG. 7A to a bias state in FIG. 7B may be rapidly performed.

The following is a description of a method of determining whether the disturbance has occurred when the control unit 104 reads the data from the memory 102.

As illustrated in FIG. 1, the control unit 104 includes the first detection amplifier 106 and the second detection amplifier 108. The first detection amplifier 106 and the second detection amplifier 108 are connected to the memory cell selected by the control unit 104 and simultaneously detect a current flowing to the selected memory cell by using different reference values. Note that in the present embodiment the control unit 104 includes two amplifiers (the first detection amplifier 106 and the second detection amplifier 108) for detecting the current, by way of example only. Alternatively, the control unit 104 may include one detection amplifier that measures twice using different reference values, i.e., one detection amplifier that is configured to function as the first detection amplifier 106 and also as the second detection amplifier 108.

The first detection amplifier 106 is used for normal reading and detects the current flowing to the selected memory cell.

The second detection amplifier 108 determines whether the disturbance has occurred in the memory cell including the LRS written thereto. For example, the second detection amplifier 108 calculates resistance of the selected memory cell from the current flowing thereto and, when the resistance is larger than a normal resistance value of the LRS by a predetermined ratio (e.g., 20%) or more, determines that the disturbance has occurred. Note that this determination method is employed by way of example only, and a different criterion may be used for the determination.

Figure 8:
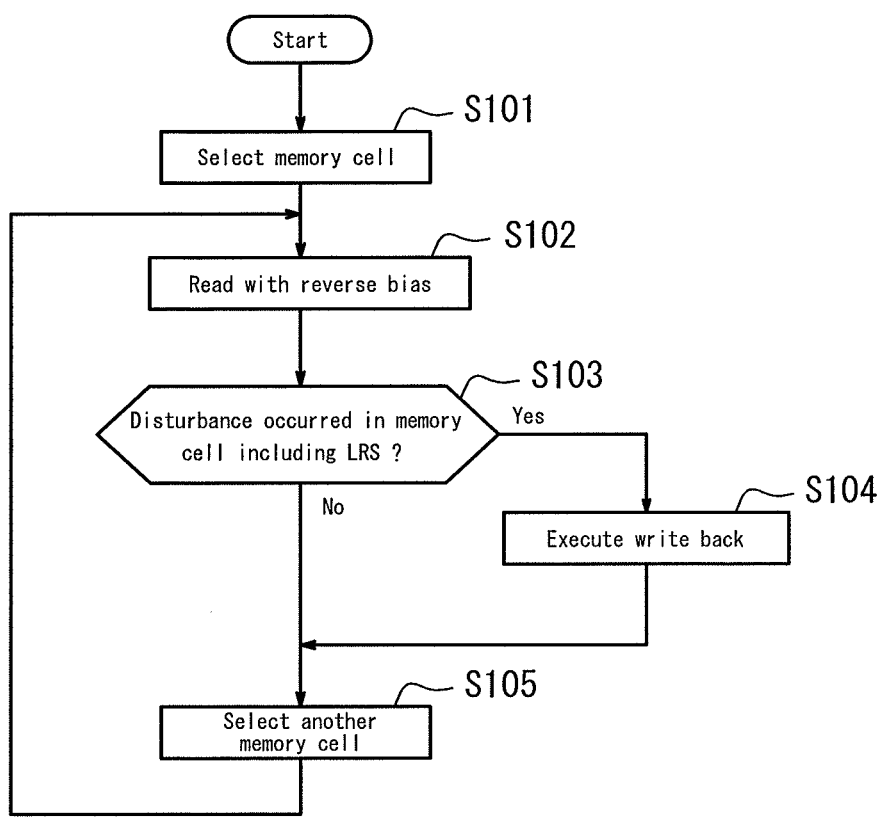
FIG. 8 is a flowchart of a reading operation according to one embodiment of the present invention.

Referring to a flowchart illustrated in FIG. 8, a process of the nonvolatile storage device 100 to read the data will be described.

The control unit 104 selects the memory cell to be read from the memory 102 (step S101). The control unit 104 applies the reverse bias to the selected memory cell and thereby reads the data (step S102).

The second detection amplifier 108 determines whether the disturbance has occurred in the memory cell including the LRS written thereto, that is, whether the resistance is larger than the normal resistance value of the LRS by 20% or more (step S103).

When it is determined as Yes at step S103, the control unit 104 executes the write back to the memory cell that has been read (step S104). Then, the control unit 104 selects another memory cell to be read (step S105) and returns to step S102.

When it is determined as No at step S103, the control unit 104 selects another memory cell to be read (step S105) and returns to step S102.

According to the nonvolatile storage device 100 of the present invention, as described above, based on whether the HRS and the LRS is written to the resistance storage element, the direction to apply the bias at the time of the verification is appropriately selected. Thereby, the writing speed may be improved by applying a high voltage, while the occurrence of the disturbance is prevented.

Also, since the nonvolatile storage device 100 applies the same voltage to the source line at the time of the set and at the time of the verification thereof, the transition time from the set to the verification thereof is reduced. Further, since the nonvolatile storage device 100 applies the same voltage to the source line at the time of the reset and at the time of the verification thereof, the transition time from the reset to the verification thereof is reduced.

Also, the nonvolatile storage device 100 according to the present invention determines whether the disturbance has occurred when reading the data from the resistance storage element and, when the disturbance has occurred, executes the write back. Therefore, the nonvolatile storage device 100 may improve a reading speed by applying a high voltage to the resistance storage element at the time of reading.

Also, the nonvolatile storage device 100 according to the present invention applies the same voltage to the source line when reading the data from the resistance storage element and when executing the write back. Thereby, the transition time from the reading to the write back may be reduced.

Further, the nonvolatile storage device 100 according to the present invention may determine whether the disturbance has occurred based on whether the resistance of the resistance storage element including the LRS written thereto is increased by the predetermined ratio or more.

Although the present invention has been described based on the figures and the embodiment, it is to be understood that various modifications and changes may be implemented based on the present disclosure by those who are ordinarily skilled in the art. Accordingly, such modifications and changes are included in the scope of the present invention.

For example, although the memory cell of the 1T1R type is used in the above embodiment, the present invention is not limited thereto but may use a memory cell of 1R type, or may be otherwise configured.

Also, although specific bias voltages are applied in the above embodiment, these values are used by way of example only, and appropriate values may be selected in accordance with characteristics of the memory cell actually used.

Further, although the ReRAM is used for example in the above embodiment, the present invention is not limited thereto. The present invention is applicable to a nonvolatile memory that shows similar dependence on the bias voltage.

Further, although in the above embodiment the reverse bias is applied at the time of the verification of the HRS and the forward bias is applied at the time of the verification of the LRS, when the resistance storage element shows disturbance characteristics opposite to that described in the above embodiment (that is, when the disturbance does not occur when the forward bias is applied at the time of the verification of the HRS and when the reverse bias is applied at the time of the verification of the LRS), the forward bias and the reverse bias may be applied at the time of the verification of the HRS and at the time of the verification of the LRS, respectively.

REFERENCE SIGNS LIST

100 nonvolatile storage device
102 memory
104 control unit
106 first detection amplifier
108 second detection amplifier

The invention claimed is:
1. A nonvolatile storage device comprising:
a memory including at least one nonvolatile resistance storage element; and
a control unit configured to write a high resistance state or a low resistance state to the resistance storage element, wherein the control unit applies a bias to the resistance storage element in a verification operation carried out after writing the high resistance state, or applies a bias to the resistance storage element in a verification operation carried out after writing the low resistance state, these biases being in directions opposite to each other,
wherein the control unit applies a reverse bias to the resistance storage element at a time of the verification operation carried out after writing the high resistance state, or applies a forward bias to the resistance storage element at a time of the verification operation carried out after writing the low resistance state,
wherein a direction of the reverse bias is the direction in which a voltage pulse is applied at a time of writing the high resistance, wherein a direction of the forward bias is the direction in which a voltage pulse is applied at a time of writing the low resistance, wherein an absolute amplitude of the bias applied at the time of the verification operation carried out after writing the high resistance state is different from an absolute amplitude of the bias applied at the time of the verification operation carried out after writing the low resistance state, and wherein the verification operation is an operation for verifying whether the writing of the high resistance state or the low resistance state is successfully carried out.

2. The nonvolatile storage device according to claim 1, wherein the control unit applies the same voltage to a source of the resistance storage element at the time of writing the high resistance state and at the time of the verification operation carried out thereafter, or applies the same voltage to the source of the resistance storage element at the time of writing the low resistance state and at the time of the verification operation carried out thereafter.

3. The nonvolatile storage device according to claim 1, wherein the control unit applies the same voltage to a source of the resistance storage element at the time of writing the high resistance state and at the time of the verification operation carried out thereafter, or applies the same voltage to the source of the resistance storage element at the time of writing the low resistance state and at the time of the verification operation carried out thereafter.

4. The nonvolatile storage device according to claim 1, wherein the control unit applies the reverse bias to the resistance storage element when reading data from the memory.

5. The nonvolatile storage device according to claim 4, wherein the control unit, when determining at the time of reading the data from the memory that disturbance has been occurred in a resistance storage element including the low resistance state written thereto, writes the low resistance state to the resistance storage element.

6. The nonvolatile storage device according to claim 5, the control unit, when determining that the disturbance has been occurred and writes the low resistance state to the resistance storage element, applies the same voltage as that applied at the time of reading the data from the memory to the source of the resistance storage element.

7. The nonvolatile storage device according to claim 5, wherein the control unit determines whether the disturbance has been occurred based on whether resistance of the resistance storage element including the low resistance state written thereto is larger than a normal resistance value of the low resistance state by at least a predetermined ratio.

8. The nonvolatile storage device according to claim 6, wherein the control unit determines whether the disturbance has occurred based on whether resistance of the resistance storage element including the low resistance state written thereto is larger than a normal resistance value of the low resistance state by at least a predetermined ratio.

9. A method of controlling a nonvolatile storage device having a memory including at least one nonvolatile resistance storage element, the method comprising:

a writing step of writing a high resistance state or a low resistance state to the resistance storage element; and a verification step of verifying successful writing of the high resistance state or the low resistance state carried out after the writing step, wherein the verification step applies a bias to the resistance storage element in a verification operation carried out after writing the high resistance state, or applies a bias to the resistance storage element in a verification operation carried out after writing the low resistance state, these biases being in directions opposite to each other, wherein, in the verification step, a reverse bias is applied to the resistance storage element at a time of the verification operation carried out after writing the high resistance state, or a forward bias is applied to the resistance storage element at the time of the verification operation carried out after writing the low resistance state, wherein a direction of the reverse bias is the direction in which a voltage pulse is applied at a time of writing the high resistance, wherein a direction of the forward bias is the direction in which a voltage pulse is applied at a time of writing the low resistance, wherein an absolute amplitude of the bias applied at the time of the verification operation carried out after writing the high resistance state is different from an absolute amplitude of the bias applied at the time of the verification operation carried out after writing the low resistance state, and wherein the verficiation operation is an operation for verifying whether the writing of the high resistance state or the low resistance state is successfully carried out.

* * * * *